United States Patent
Fujimoto

(10) Patent No.: US 7,160,428 B2
(45) Date of Patent: Jan. 9, 2007

(54) PLATING MACHINE AND PROCESS FOR PRODUCING FILM CARRIER TAPES FOR MOUNTING ELECTRONIC PARTS

(75) Inventor: Akira Fujimoto, Yamaguchi (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 300 days.

(21) Appl. No.: 10/861,059

(22) Filed: Jun. 4, 2004

(65) Prior Publication Data

US 2004/0245111 A1  Dec. 9, 2004

(30) Foreign Application Priority Data

Jun. 6, 2003  (JP)  ............................. 2003-162466

(51) Int. Cl.
  *C25D 5/02*  (2006.01)
  *C25D 5/00*  (2006.01)
  *C25D 7/06*  (2006.01)
  *C25D 17/00*  (2006.01)

(52) U.S. Cl. ...................... 205/134; 205/129; 205/137; 205/138; 204/198; 204/206

(58) Field of Classification Search ................ 205/134, 205/129, 137, 138, 140, 96, 98; 204/198, 204/206
See application file for complete search history.

(56) References Cited

U.S. PATENT DOCUMENTS 3,267,017 A * 8/1966 Greene et al. .............. 204/210
4,322,280 A * 3/1982 Houska et al. .............. 204/207

FOREIGN PATENT DOCUMENTS

JP   11-204585 A   7/1999
JP   2002317296 A * 10/2002

* cited by examiner

*Primary Examiner*—Nam Nguyen
*Assistant Examiner*—Luan V. Van
(74) *Attorney, Agent, or Firm*—The Webb Law Firm

(57) ABSTRACT

A plating machine for plating a film carrier tape for mounting electronic parts includes a plating tank for plating wiring patterns of a film carrier tape and also has a bubble adhesion prevention means that is position adjustable with respect to the surface of a plating solution contained in the plating tank. The process for producing film carrier tapes for mounting electronic parts comprises partially immersing a film carrier tape in a plating solution contained in a plating tank and selectively plating wiring patterns formed in the immersed area while adsorbing bubbles generated in the plating solution to a bubble adhesion prevention means arranged at the surface of the plating solution.

14 Claims, 4 Drawing Sheets

PLATING MACHINE AND PROCESS FOR PRODUCING FILM CARRIER TAPES FOR MOUNTING ELECTRONIC PARTS

FIELD OF THE INVENTION

The present invention relates to a plating machine for partially plating film carrier tapes for mounting electronic parts by immersing a selected part of the film carrier tapes for mounting electronic parts in a plating solution (plating by liquid level control), and to a process for producing film carrier tapes for mounting electronic parts with use of the plating machine.

BACKGROUND OF THE INVENTION

Electronic parts are incorporated in an apparatus with use of a film carrier tape constituted of a flexible insulating film and a number of wiring patterns formed thereon.

Such film carrier tapes for mounting electronic parts include TAB (tape automated bonding) tapes, CSP (chip size package) tapes, COF (chip on film) tapes, BGA (ball grid array) tapes, ASIC (application specific integrated circuit) tapes, two-metal (double-sided) tapes and tapes for multi-layer interconnection. These film carrier tapes have inner leads for the connection with terminals of electronic parts, and outer leads, which are in series with respective inner leads, for establishing connection with outside devices.

Depending on the type of such film carrier tapes, it is often required to plate the outer leads with solder, an alloy of tin and lead. Since the solder contains lead which is a heavy metal, it has been replaced with a tin-bismuth alloy due to the recent global request for elimination of the lead metal. Plating with the solder or tin-bismuth alloy is generally performed on outer leads of film carriers that are provided in the vicinity of the edges in the width direction of the long film carrier tape. To accomplish such selective plating on the outer leads near the edges in the width direction of the film carrier tape, the film carrier tape is fed standing perpendicular to the surface of the plating solution so that an area near the downside edge in the width direction thereof will be immersed in the plating solution. As a consequence, the wiring patterns (outer leads) found in the immersed area can be selectively plated in the plating solution. This selective plating method is generally called the "plating by liquid level control". One operation of the plating by liquid level control results in formation of deposits of, for example, the tin-bismuth alloy on the outer leads in the vicinity of one tape edge in the width direction. Another operation for the reverse edge of the film carrier tape produces the same effect on the other side. Accordingly, the outer leads in both edge areas in the width direction of the film carrier tape can be plated with the tin-bismuth alloy. On the other hand, in the plating by liquid level control, inner leads found in the center area in the width direction of the film carrier tape remain unplated with the tin-bismuth alloy.

In the above plating by liquid level control, electroplating is generally employed to form deposits of the tin-bismuth alloy. Specifically, the electroplating is performed in a plating tank filled with a tin-bismuth alloy plating solution in a manner such that the desired portion of the film carrier tape for mounting electronic parts is immersed in the plating solution and an electric current is applied using the wiring patterns (bus conductor leads) of the film carrier tape as cathodes and insoluble electrodes of platinum or the like as anodes.

When a voltage is applied between the electrodes to carry out the electroplating, various electrochemical reactions take place in the plating solution, causing generation of gas from the anodes and cathodes. For example, the following reactions occur in the anodes and cathodes:

Anodes: $2OH^- \rightarrow \frac{1}{2}O_2 + H_2O + 2e^-$
Cathodes: $Sn^{2+} + 2e^- \rightarrow Sn$
$Bi^{3+} + 3e^- \rightarrow Bi$ When the current density is high, the reaction $H_+ + e^- \rightarrow \frac{1}{2}H_2$ also occurs in the cathodes.

It is often the case that the plating solution contains a surfactant or the like for enhancing affinity for the object to be plated. The gas generated during the electroplating eventually forms bubbles on the surface of the plating solution. When the plating solution contains a surfactant in particular, these bubbles are more resistant to breakage and survive relatively longer floating on the plating solution.

Meanwhile, it is conventional practice in the production of film carrier tapes for mounting electronic parts that a film carrier tape wound on a reel is unwound and fed into and through, for example, a plating tank in which the desired metal is deposited on the tape. When the film carrier tape travels in the plating tank, the plating solution also is caused to flow in the traveling direction of the tape. The flow of the plating solution carries the bubbles formed, occasionally bringing some bubbles to adhesion to the traveling film carrier tape.

In the plating by liquid level control, the outer leads to be plated generally have width of several tens of μm, which is the level that will lead to plating failure by any slight variation in the liquid level of plating solution due to the adhered bubbles.

The present invention has an object of providing a plating machine for plating a film carrier tape for mounting electronic parts that can reduce the probability that bubbles of gas which are vigorously generated in a plating solution during electroplating will float in the vicinity of wiring patterns and attach to the wiring patterns.

It is another object of the present invention to provide a process for producing film carrier tapes for mounting electronic parts that allows for the formation of deposits with minimum adverse effects of bubbles even if such bubbles are being vigorously generated in the plating solution during electroplating.

SUMMARY OF THE INVENTION

The plating machine for plating a film carrier tape for mounting electronic parts according to the present invention comprises a plating tank for plating wiring patterns of a film carrier tape, this plating machine having a bubble adhesion prevention means that is position adjustable with respect to the surface of a plating solution contained in the plating tank.

The process for producing film carrier tapes for mounting electronic parts according to the present invention comprises a step of plating a film carrier tape by the abovementioned plating machine, this plating step comprising partially immersing a film carrier tape in a plating solution contained in the plating tank and selectively plating the wiring patterns formed in the immersed area while adsorbing bubbles generated in the plating solution to the bubble adhesion prevention means arranged at the surface of the plating solution.

Deposits such as of the tin-bismuth alloy are generally formed by electroplating. Electroplating can be accomplished in a shorter period of time by setting the electric current at higher level. However, this causes generation of oxygen gas from the anodes because the anodes used are insoluble electrodes.

Even after the bubbles have formed, the film carrier tape keeps running at a considerable speed. Consequently, the bubbles are caused to adhere to the film carrier surface and travel with the film carrier tape. Further, the travel of the film carrier tape through the plating machine generates a flow of the plating solution. The flow carries the bubbles occurring from the anodes or cathodes toward the film carriers, possibly resulting in some adhered bubbles to the film carriers at the interface between the tape and the plating solution. Such adhered bubbles can disturb evenness in the liquid level, and accordingly uniformity of the deposits formed may be deteriorated. To prevent the bubbles from adhering to the film carrier tape, the plating machine of the present invention is provided with a bubble adhesion prevention means that enables the prevention of adhered bubbles to the film carrier tape.

The plating machine for plating a film carrier tape for mounting electronic parts of the present invention can reduce the probability that the bubbles generated in the plating solution during electroplating will float in the vicinity of and adhere to the wiring patterns.

The bubble adhesion prevention means is preferably provided along the traveling direction of the film carrier tape through the plating tank.

DETAILED DESCRIPTION OF THE INVENTION

Hereinbelow, the plating machine for plating a film carrier tape for mounting electronic parts, and the process for producing film carrier tapes for mounting electronic parts with use of the plating machine according to the present invention will be described in detail.

Figure 1:
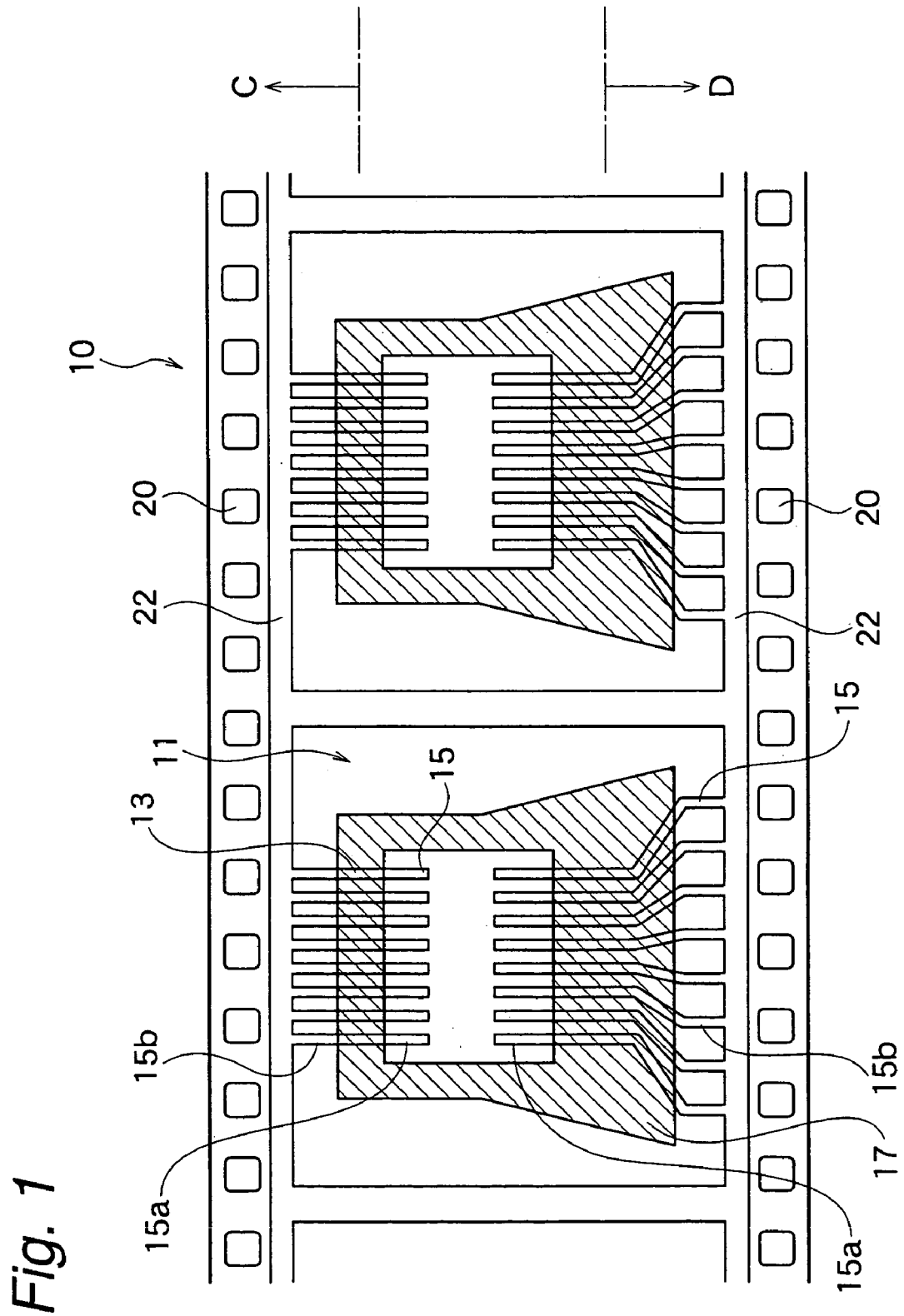
FIG. 1 is a plan view showing an embodiment of the film carrier tape for mounting electronic parts according to the present invention.

FIG. 1 is a plan view showing an embodiment of the film carrier tape for mounting electronic parts (hereinafter the "film carrier tape") that is produced using the plating machine according to the present invention.

As illustrated in FIG. 1, the film carrier tape 10 is constituted includes an insulating film 11, wiring patterns 13 formed on the insulating film 11, and solder resist layers 17 formed on each wiring pattern 13 so as to expose connection leads 15.

The insulating film 11 has a chemical resistance against chemicals, such as acids, that will contact therewith in the etching. The insulating film 11 also has a heat resistance such that it will not change its properties by the heat applied in the bonding. Materials for the insulating film include polyesters, polyamides, polyimides and liquid crystal polymers. In the present invention, polyimides are particularly preferable to make the insulating film.

Exemplary polyimides usable to make the insulating film 11 include wholly aromatic polyimides that are generally synthesized from pyromellitic acid dianhydride and aromatic diamine, and wholly aromatic polyimides having a biphenyl skeleton that are synthesized from biphenyltetracarboxylic acid dianhydride and aromatic diamine. In the present invention, any of these polyimides may be employed. These polyimides have more excellent heat resistance and chemical resistance than other resins.

In the present invention, the insulating film 11, which is preferably a polyimide film, will generally have an average thickness of 5 to 150 μm, preferably 5 to 125 μm, and particularly preferably 5 to 100 μm. When the polyimide film has an average thickness within these ranges, heating through the polyimide film can effectively achieve electrical connection required at the leads 15.

In the production of the film carrier tape 10, the insulating film 11 may be optionally provided with appropriate holes according to the type of the objective film carrier tape. Such holes include sprocket holes (given the referential number 20 in the drawings), through-holes for inserting solder balls, device holes, positioning holes and slits for establishing electrical connection between the leads and electrodes of electronic parts.

The width of the insulating film 11 is not particularly limited. Since there should not be more than one film carrier across the width of the insulating film 11 in order that the plating with tin-bismuth alloy can be effected on the selected part of leads 15 in the plating machine, the insulating film (polyimide film) 11 is preferably 35 mm wide or 70 mm wide depending on the width of the film carrier to be manufactured.

The insulating film 11 has wiring patterns 13 formed on its surface in desired configuration. Since part of the leads 15 will be electroplated with tin-bismuth alloy in the plating machine of the present invention, the wiring patterns 13 are each connected with a current supply wiring (bus conductor wiring) 22 which supplies electric current to the wiring patterns 13 to effect electroplating with tin-bismuth alloy.

The current supply wiring 22 is formed straight in the longer direction of the insulating film 11, inside and along sprocket holes 20 that are provided in edge areas on both sides of the insulating film 11.

The wiring patterns 13 are each covered with a solder resist layer 17 in all surface but the areas corresponding to the inner and outer leads 15 as shown in FIG. 1.

The solder resist layers 17 are formed so as to protect the wiring patterns 13 between inner leads 15a for connection with electrodes of electronic parts and outer leads 15b that connect the film carriers with outside devices. The solder resist layers 17 are not formed on the current supply wiring 22. Preferably, the wiring patterns 13 exposed from the solder resist layers 17 are each covered with a tin deposit.

After the solder resist layers 17 have been formed on the film carrier tape 10, the exposed wiring patterns 13, which may be covered with tin deposits, are plated with tin-bismuth alloy.

Figure 2:
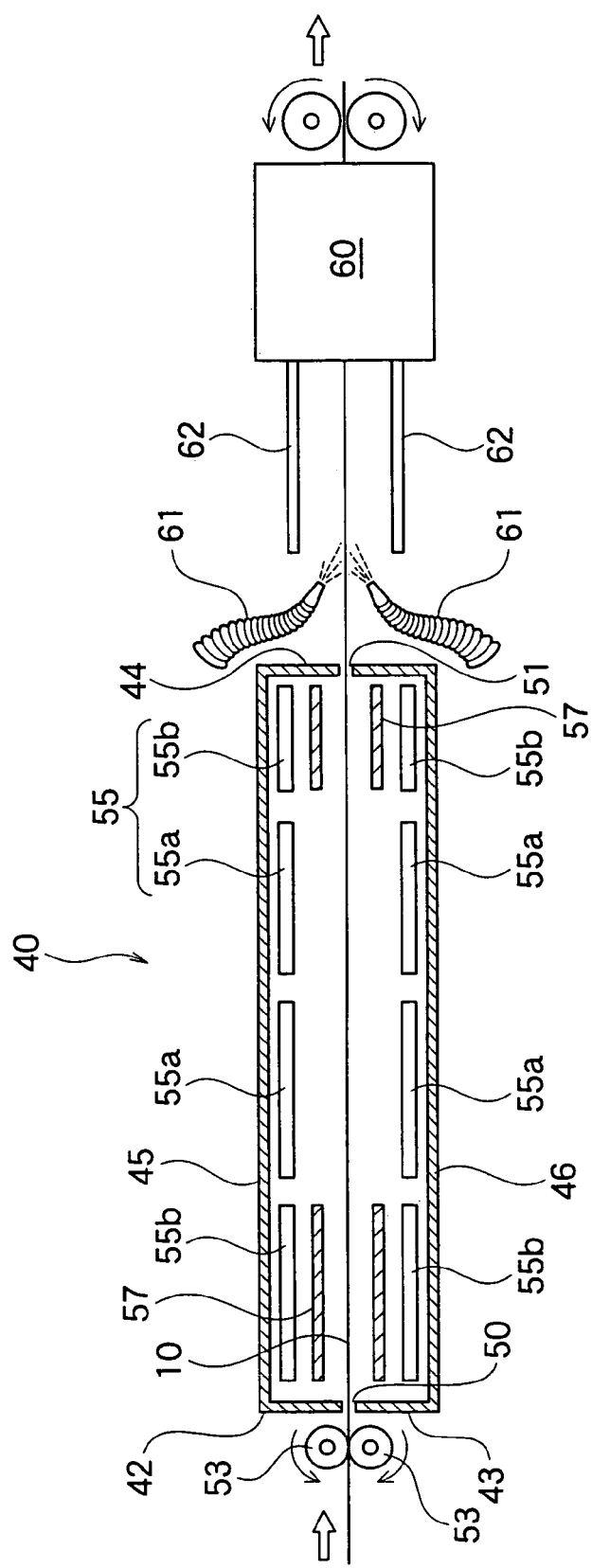
FIG. 2 is a plan view showing an embodiment of the plating machine for plating a film carrier tape for mounting electronic parts according to the present invention.
Figure 3:
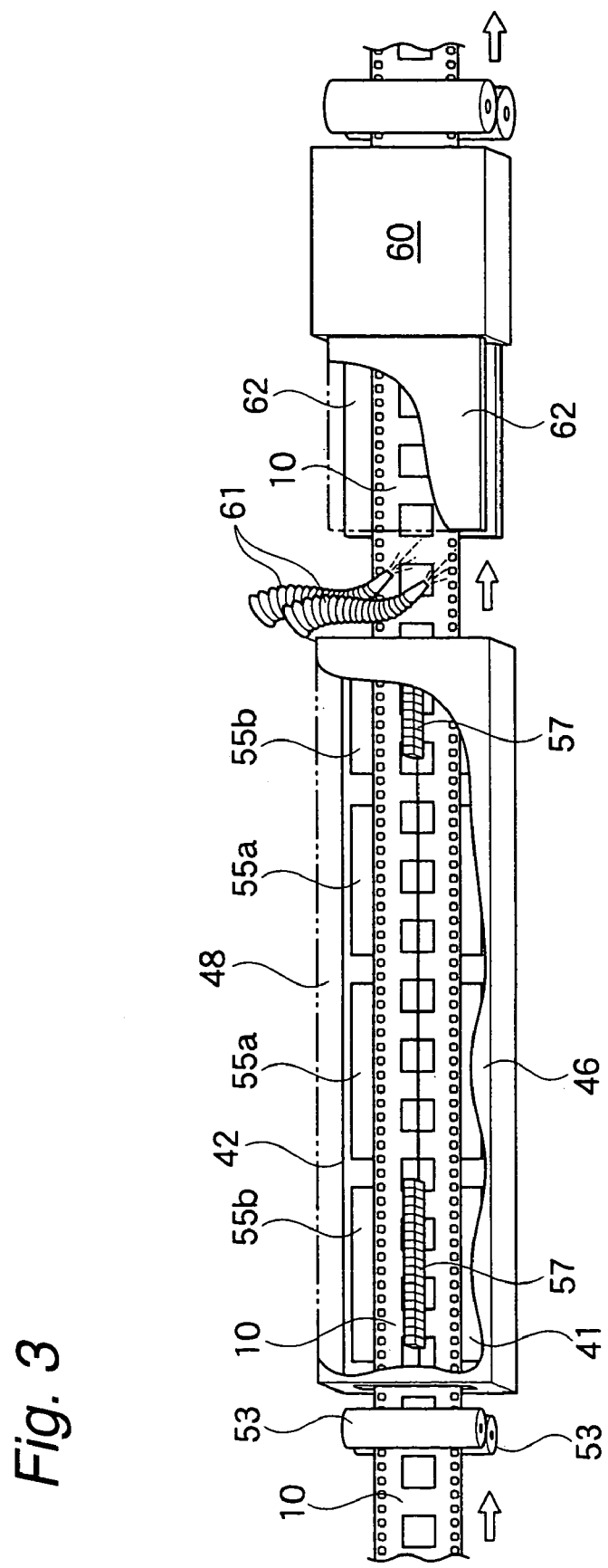
FIG. 3 is a partially cutaway side view showing the plating machine illustrated in FIG. 2.
Figure 4:
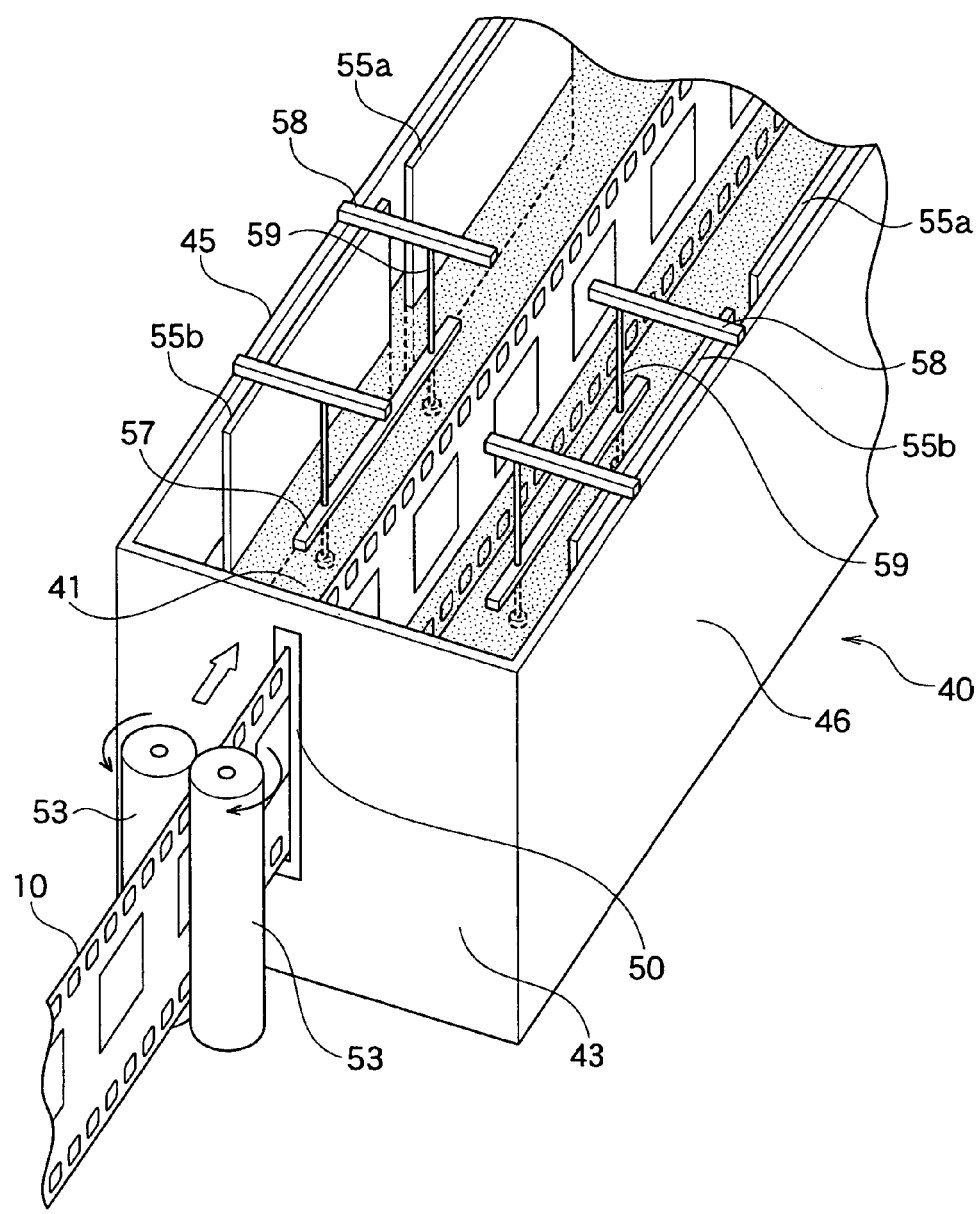
FIG. 4 is a partially cutaway top perspective view showing the plating machine illustrated in FIG. 2.

FIG. 2 is a plan view showing an embodiment of the plating machine for plating a film carrier tape for mounting electronic parts according to the present invention. FIG. 3 is a partially cutaway side view of the plating machine illustrated in FIG. 2. FIG. 4 is a partially cutaway top perspective view showing the plating machine illustrated in FIG. 2.

As illustrated in FIGS. 2 and 3, the plating machine 40 includes a plating tank 42 in which a plating solution 41 is contained, a slit inlet opening 50 through which the film carrier tape 10 is continuously introduced into the plating tank 42, and a slit outlet opening 51 through which the film carrier tape 10 is discharged from the plating tank.

The plating tank 42 has a box shape, generally rectangular in cross section, and is long laterally along the traveling direction of the film carrier tape 10 to be plated.

In a sidewall 43 upstream of the traveling direction of the film carrier tape 10, the plating tank 42 has the slit inlet opening 50 in which the film carrier tape 10 is continuously introduced.

In a sidewall 44 downstream of the traveling direction of the film carrier tape 10, the plating tank 42 has the slit outlet opening 51 from which the film carrier tape 10 is discharged.

Upstream of the slit inlet opening 50 lies a plating electricity supply means 53 that supplies an electric current needed for the plating to the current supply wiring 22. Thus, the film carrier tape 10 introduced in the plating tank 42 is electroplated. Preferably, the plating electricity supply means 53 is always in contact with the current supply wiring 22 on the film carrier tape being introduced into the plating tank, and it is generally constituted of conductive metal rollers. The plating electricity supply means (rollers) 53 that supplies electricity for the electroplating, may also function as a conventional feeding means to feed the film carrier tape.

Inside of sidewalls 45 and 46 (the longer sidewalls) of the plating tank 42 that extend substantially parallel to the traveling direction of the film carrier tape 10, anodes 55 are arranged a certain distance apart from the film carrier tape 10 as the cathode.

The anodes 55 function, of course, as electrodes and also have a function to supplement the tin consumed during the plating thereby to keep the tin concentration in the plating solution at a constant level. The tin anodes used herein are generally composed of relatively pure tin metal. In general, the tin content in the tin electrodes will range from 99.5 to 99.9%.

The plating solution used in the present invention contains bismuth, which in an acidic condition will easily substitute with surface tin atoms of the tin metal electrodes.

Therefore, when the anodes are all tin electrodes, the composition of the tin-bismuth alloy plating solution may become unstable due to the substitution of the surface tin atoms of the anodes with the bismuth. Since the consumption of tin in the tin-bismuth alloy plating solution has to be proportionally covered by the elution of tin from the tin metal anodes, the anodes 55 are preferably composed of tin metal electrodes 55a and electrodes (insoluble anodes) 55b that will not dissolve in the plating solution 41.

The insoluble anodes 55b preferably account for 70 to 100% of the total area of the tin metal electrodes 55a and insoluble anodes 55b.

The tin metal electrodes 55a and the insoluble anodes 55b are preferably arranged separately in the longer direction of the plating tank 42. A voltage can be applied between the anodes 55 and the plating electricity supply means 53, and the plating electricity supply means 53 is electrically connected with the plating current supply wiring 22 formed in the film carrier tape 10. Therefore, electroplating may be performed using the wiring patterns in the film carrier tape 10 as the cathodes, and the tin metal electrodes 55a and insoluble anodes 55b as the anodes. Thus, tin-bismuth alloy deposits may be formed on the wiring patterns that are in contact with the plating solution.

Meanwhile, a bubble adhesion prevention means 57 is provided between and in a certain distance apart from the anodes 55 and the film carrier tape (cathode) 10 in a configuration such that the bubble adhesion prevention means will face the film carrier tape without contacting any of these members.

The bubble adhesion prevention means 57 works to collect bubbles floating on the plating solution and cause them to break.

As described hereinabove, electroplating is often accompanied with generation of hydrogen or oxygen gas from the anodes or cathodes. The bubbles of the gas are carried by the flow of the plating solution which runs in the traveling direction of the film carrier tape, causing unevenness of the level-controlled surface of the plating solution. If such bubbles attach to the film carriers, deposits formed by the electroplating are likely to be ununiform.

In the present invention, the bubble adhesion prevention means 57 is arranged in the plating solution in order to prevent the existing bubbles from adhering to the film carrier tape and to collect and break the bubbles. The bubble adhesion prevention means 57 is located between the anodes 55 and the film carrier tape (cathode) 10 such that it is free from contact with any of these members. With this arrangement that allows a certain distance between the members, the bubbles floating on the plating solution are broken at or adsorbed to the edge portion of the bubble adhesion prevention means 57. The bubble adhesion prevention means 57 is desirably arranged approximately parallel to the film carrier tape 10 and with a spacing of 5 to 50 mm, and preferably 10 to 40 mm from the film carrier tape 10. This arrangement enables the effective collection and breaking of bubbles floating on the plating solution. Accordingly, the bubbles are substantially prevented from floating in the vicinity of the wiring patterns of the film carrier tape 10 or from attaching to the wiring patterns.

Therefore, the use of the bubble adhesion prevention means 57 leads to sufficient plating of the wiring patterns in the vicinity of the surface of the plating solution. Consequently, deposits can be formed in the desired area on the wiring patterns.

The bubble adhesion prevention means 57 is preferably provided in the flow of the plating solution, and is more preferably arranged to be partially immersed in and partially exposed from the plating solution. The bubble adhesion prevention means 57 thus arranged adsorbs bubbles to its surface due to the surface tension, and the adsorbed bubbles attract other bubbles. Accordingly, the bubbles on the plating solution can be adsorbed selectively to the bubble adhesion prevention means 57 and they break as a result of binding. On the other hand, the bubbles are unlikely to attach to the film carrier tape 10 because the tape is traveling in the plating solution. Further, since the bubble adhesion prevention means 57 is provided approximately parallel to the film carrier tape 10, the bubbles will not be released once attached to the surface of the bubble adhesion prevention means 57. Therefore, the influence to the level-controlled plating solution can be minimized, and the liquid level control can be facilitated.

When a plurality of the bubble adhesion prevention means 57 are provided on the side of sidewall 45 (or sidewall 46), it is not necessary to arrange them in an approximately linear configuration in the longer direction of the plating tank 42. That is, positions of the plural bubble adhesion prevention means 57 can be determined individually.

FIGS. 2 to 4 illustrate an embodiment in which the bubble adhesion prevention means 57 are provided between the insoluble anodes 55b and the film carrier tape 10. However, the bubble adhesion prevention means 57 may be arranged between the tin metal electrodes 55a and the film carrier tape 10. It is also possible that one bubble adhesion prevention means 57 is provided between the tin metal electrode 55a and the film carrier tape 10 and continuously between the insoluble anode 55b and the film carrier tape 10. At least one bubble adhesion prevention means 57 should be provided on each side of the sidewalls 45 and 46, and the width thereof is not particularly limited.

The material for the bubble adhesion prevention means 57 is not particularly limited as far as it can adsorb bubbles and exert a breaking or eliminating effect on the bubbles. Exemplary materials include resins and ceramics. The bubble adhesion prevention means 57 may be in the shape of, although not limited to, quadratic prism, column or triangular prism, and may be in a cylindrical form, a mesh form or the like. Moreover, the surface of it may be porous.

As shown in FIG. 4, the bubble adhesion prevention means 57 are each supported by supporting members 59 that extend downward (toward the plating solution) from arm members 58 equipped at upper edge portions of the sidewalls 45 and 46.

The arm members 58 are equipped at upper edge portions of the longer sidewalls 45 and 46 of the plating tank 42 such that they will be approximately parallel to the surface of the plating solution 41. The supporting members 59 are arranged to extend downward (toward the plating solution) from the arm members 58. The bubble adhesion prevention means 57 are each supported by the supporting members 59 so as to be vertically movable. The vertical mobility allows for the appropriate position adjustment to the desired level with respect to the surface of the plating solution. The bubble adhesion prevention means 57 should contact at least with the surface of the plating solution 41, and may be partially immersed in the plating solution 41.

The arm members 58 may be provided at upper edge portions of the sidewalls 43 and 44, and the supporting members 59 may be directly provided at the upper wall 48 of the plating tank 42.

Preferably, the arm members 58 are length adjustable in the longer direction thereof. Also preferably, the supporting members 59 are slidable in the longer direction of the arm members 58. The thus-structured arm members 58 and/or supporting members 59 provide easy control of the spacing between the bubble adhesion prevention means 57 and the film carrier tape 10. They also allow for appropriate adjustment of the position of the bubble adhesion prevention means 57 depending on the circumstance of bubble occurrence and production conditions.

The plating machine 40 has an overflow means (not shown) for keeping the plating solution at a constant quantity. Adjusting the height of the overflow means enables the control of the liquid level of the plating solution in the plating machine.

With use of the plating machine 40 described hereinabove, the film carrier tape 10 is plated to form tin-bismuth alloy deposits on the outer leads 15b.

To accomplish such selective formation of tin-bismuth alloy deposits, the film carrier tape 10 in a standing condition is continuously introduced into the plating tank 42 through the slit inlet opening 50 so that the outer leads 15b within a certain distance from the downside edge in the width direction of the film carrier tape 10 will be immersed in the plating solution of tin-bismuth alloy. Thus, the portions immersed in the plating solution can be selectively plated. This plating method will be referred to as the partial plating by liquid level control.

In the partial plating by liquid level control, the film carrier tape 10 is stood up with one longer edge down so that the outer leads 15b on the side where the formation of the tin-bismuth alloy deposit is intended (the side C in FIG. 1) will be immersed in the plating solution. Then an electric current is supplied from the current supply wiring 22 and the outer leads 15b being immersed in the plating solution are plated.

As shown in FIG. 2, the plating machine according to the present invention is preferably provided with a washing nozzle 61. The film carrier tape 10 discharged from the plating tank 42 through the slit outlet opening 51 is washed by the washing nozzle 61 until it reaches the washing device 60. The washing nozzle 61 ejects water in a predetermined quantity and at a preset water pressure to effectively wash off the plating solution sticking to the film carrier tape 10 without deforming the wiring patterns, particularly the connection leads.

The washing nozzle 61 must be arranged such that it can wash off at least the plating solution sticking to the wiring patterns of the film carrier tape 10. However, the surface with the wiring patterns can turn around depending on the standing condition of the film carrier tape 10 in the discharge through the slit outlet opening 51. Moreover, it is possible that the plating solution sticking to the backside can come to the foreside through the holes such as sprocket holes or device holes formed in the film carrier tape 10. With these in consideration, preferably two or more washing nozzles are provided to wash the film carrier tape 10 from both sides.

The washing nozzles 61 are positioned such that the film carrier tape 10 can be washed within 6 seconds, and preferably within 5 seconds after discharged from the plating tank 42 through the slit outlet opening 51. Preferably, the washing nozzles 61 are directed so as to eject water toward the traveling direction of the film carrier tape 10. For appropriate adjustment of the ejection point and the ejection angle of water with respect to the film carrier tape 10, each washing nozzle 61 is preferably provided at the tip of a bellows flexible tube.

To prevent the water ejected through the washing nozzles 61 from scattering by splashing against the film carrier tape 10, the plating machine 40 is preferably equipped with receivers 62 that extend along both surfaces of the film carrier tape 10 in a substantially parallel direction.

Since the washing nozzles 61 eject washing water toward the traveling direction of the film carrier tape 10, the receivers 62 must be provided at any downstream point past the washing nozzles 61 in the traveling route of the film carrier tape 10. In the present invention, it is possible that the receivers 62, the plating tank 42 and the washing device 60 are connected in series.

As described above, the film carrier tape 10 can be washed within 6 seconds, and preferably within 5 seconds after discharged from the plating tank. Since the plating solution (of tin-bismuth alloy) can be removed almost completely from the film carrier tape 10 in such a short period of time, the substitution can be prevented from occurring between the surface tin of the tin-bismuth alloy deposits on the connection leads (outer leads), etc. and the bismuth in the plating solution sticking to the deposits.

As a consequence, the tin-bismuth alloy deposits formed on the film carrier tape in the present invention can be substantially homogeneous in terms of bismuth concentration across the thickness. That is, the composition of the tin-bismuth alloy is constant in the alloy deposits formed on the film carrier tape. Therefore, the melting point of the tin-bismuth alloy will not differ and stable bonding properties can be obtained all the time.

The tin-bismuth alloy deposits will generally range in thickness from 3.5 to 8.5 μm, and preferably from 5 to 7 μm.

In the plating with the tin-bismuth alloy, the bismuth concentration is desirably set in the range of 13 to 19 wt %, and preferably 14 to 18 wt %. This ratio of the bismuth to the tin leads to a melting point of the tin-bismuth alloy in the range of 210 to 216° C. Furthermore, the melting point does not vary widely even in the above limited range, so that bonding can be accomplished at a fixed temperature without fail.

After the plating solution sticking to the surface has been washed off as described above, the film carrier tape 10 is introduced into the washing (rinsing) device 60 by conventional means and is further washed there.

As a result of the partial plating by liquid level control described hereinabove, the tin-bismuth alloy deposits are formed on the outer leads 15b on one edge portion of the film carrier 10. Thereafter, the tin-bismuth alloy deposits will be formed on the outer leads 15b on the other edge portion of the insulating film 11. To accomplish this opposite-side plating, the film carrier tape that has been washed in the washing device 60 is stood downside up so that the edge portion of the insulating film where the tin-bismuth alloy deposits are newly desired will be downward. Subsequently, the outer leads 15b on the downside (side D in FIG. 1) are immersed in the plating solution 41 to carry out plating by the aforesaid procedure. After the plating, the plating solution is washed off as described above.

In the resulting film carrier tape, the tin-bismuth alloy deposits are formed on the outer leads 15b provided adjacent to the sprocket holes on both edge portions in the width direction of the insulating film 11. On the other hand, the inner leads 15a near the center of the film carrier are covered with the tin deposits.

When the bismuth content is measured across the thickness of the tin-bismuth alloy deposits on the outer leads 15b, the bismuth content is substantially the same in the surface of and deep inside the alloy deposits. That is, the bismuth distribution is substantially even within the deposits. Accordingly, the melting point will not vary drastically from the surface to deep inside of the tin-bismuth alloy deposits.

Although the above description of the plating machine in the present invention is directed to an embodiment wherein the plating solution is of tin-bismuth alloy, the plating solution that can be charged in the plating machine is not limited thereto. In the present invention, any plating solutions generally employed in the electroplating and electroless plating, such as of nickel, gold, palladium, tin and tin-lead alloy, may be used.

The tin-bismuth alloy plating solution for use in the present process for producing film carrier tapes for mounting electronic parts may be a conventional one. For example, a plating solution may be employed which has a tin concentration of 50 to 60 g/l (in terms of metal) and a bismuth concentration of 20 to 30 g/l (in terms of metal) with respect to a sulfuric acid aqueous solution. Also, the tin-bismuth alloy plating solution may contain, for example, a surfactant or a lower alcohol such as methanol. In carrying out the plating with the tin-bismuth alloy, plating conditions such as electric current and solution temperature may be appropriately selected.

The plating machine for plating a film carrier tape for mounting electronic parts according to the present invention can substantially prevent bubbles generated in a plating solution during electroplating from floating in the vicinity of wiring patterns and from attaching to the wiring patterns.

According to the process for producing film carrier tapes for mounting electronic parts of the present invention, deposits can be formed in the desired area and thickness even when bubbles are generated in a plating solution during electroplating since the process enables the substantially complete prevention of adverse effects of such bubbles to the formation of deposits that could be encountered at the surface of the plating solution.

EXAMPLES

Hereinbelow, the plating machine for plating a film carrier tape for mounting electronic parts, and the process for producing film carrier tapes for mounting electronic parts with use of the plating machine will be described in detail by the following Example. However, it should be construed that the invention is in no way limited to the Example.

Example 1

A polyimide long film (UPILEX®-S available from UBE INDUSTRIES, LTD.), which was 50 μm in average thickness, 48 mm in width and 120 m in length, was perforated to produce a number of sprocket holes in the vicinity of both edges in the width direction.

Thereafter, an electrodeposited copper foil having an average thickness of 25 μm was bonded onto the polyimide film. The electrodeposited copper foil was then coated with a photosensitive resin, and the resin was exposed by light and developed to form resin patterns.

Subsequently, the electrodeposited copper foil was etched using the above-formed patterns as a masking material. Thus, wiring patterns of copper were produced. The masking material (exposed resin pattern) was removed by alkali cleaning.

The wiring patterns were then coated with a coating solution of solder resist in all surface other than the areas corresponding to inner and outer leads. The coating was then dried to give a solder resist layer.

The tape with the solder resist layer produced as described above was reeled and then fed into a plating tank containing a tin solution. According to the common procedure, leads of the film carriers were electroless plated and tin deposits were formed in an average thickness of 0.43 μm. After the tin deposits had been thus formed, the film carrier tape was discharged from the tin-plating tank, washed with water, dried and reeled together with an embossed tape as a spacer. Thus, a feed reel was prepared in which the film carrier tape was wound with the embossed spacer tape.

The film carrier tape was fed from the feed reel into a plating tank through a slit inlet opening. FIG. 4 illustrates the plating machine used in this embodiment. The slit inlet opening was open in a direction such that the film carrier tape could be introduced in a perpendicular relation to the surface of plating solution. In the plating tank, bubble adhesion prevention means of approximately the same length as insoluble-anodes were provided 20 mm apart from the film carrier tape. The bubble adhesion prevention means were immersed in the plating solution to the depth of 5 mm. The bubble adhesion prevention means were each made of a 7 mm diameter vinyl chloride bar, and they were fixed by support parts whose one sides were secured at the upper peripheral areas of the plating tank. The bubble adhesion prevention means were each positioned such that the upper half thereof was exposed from the plating solution and the lower half was immersed in the plating solution. Inside the plating tank was provided an overflow means for controlling the depth of the plating solution. The overflow means controlled the quantity of the plating solution so that when the film carrier tape shown in FIG. 1 was introduced into the plating tank in a standing condition, the tape would be immersed from the downside edge (upper edge in the figure) up to the broken line C.

In the plating tank, tin electrodes composed of 99.9% pure tin, and titanium electrodes as insoluble electrodes in the plating solution were arranged. The tin electrodes and the titanium electrodes had area percentages of 20% and 80% respectively based on the total area (100%) of the anodes immersed in the plating solution.

The plating solution of tin-bismuth alloy used in this embodiment had a basic composition of:

Tin concentration (in terms of metal): 55 g/l
Bismuth concentration (in terms of metal): 36 g/l A plating electricity supply means provided outside the slit inlet opening was operated to supply electricity to a current supply wiring formed in the film carrier tape, and thereby a voltage was applied between the anodes and the film carrier tape introduced through the slit inlet opening into the plating tank. As a consequence, tin-bismuth alloy deposits were formed in an average thickness of 6 µm on the outer leads that had been immersed in the plating solution. During the electroplating, oxygen gas occurred from the surface of the anodes and eventually became bubbles on the plating solution surface. However, these bubbles were adsorbed to the bubble adhesion prevention means and broke one after another. As a result of the adsorption and elimination of the bubbles at the bubble adhesion prevention means, substantially no bubbles attached to the traveling film carrier tape.

After the tin-bismuth alloy deposits had been formed with the liquid level control as described above, the film carrier tape was discharged through the slit outlet opening and washed with water using two washing nozzles. Thereafter, the film carrier tape was introduced into a washing device for further washing, then dried and wound on a wind-up reel together with an embossed tape as a spacer.

The above plating that involved strict control with respect to the plated areas achieved reduced adverse effects of bubbles to the area and thickness of the deposits. Accordingly, the tin-bismuth alloy deposits were formed on the leads with a substantially reduced rate of plating failure, one third or less of the conventional cases.

What is claimed is:

1. A process for producing film carrier tapes for mounting electronic parts comprising a step of plating wiring patterns of a film carrier tape, said plating comprising partially immersing one edge of a film carrier tape in a plating solution contained in a plating tank, moving said film carrier tape in a traveling direction wherein a longitudinal axis of the film carrier tape is substantially parallel to a surface of the plating solution, and selectively plating wiring patterns formed in the immersed edge area of the film carrier tape while collecting and breaking bubbles generated in the plating solution on a bubble adhesion prevention means arranged at the surface of the plating solution and positioned along the traveling direction of the film carrier tape.

2. The process according to claim 1, wherein the plating step comprises continuously introducing the film carrier tape into the plating tank so as to immerse part of the film carrier tape in the plating solution contained in the plating tank, selectively plating the wiring patterns formed in the immersed area while collecting and breaking bubbles generated in the plating solution to the bubble adhesion prevention means arranged at the surface of the plating solution, and continuously discharging the plated film carrier tape.

3. The process according to claim 1, wherein the plating step comprises selectively plating the wiring patterns formed in the area of the film carrier tape immersed in the plating solution while collecting and breaking bubbles generated in the plating solution to the bubble adhesion prevention means arranged so as to be partially immersed in and partially exposed from the plating solution.

4. The process according to claim 1, comprising carrying out at least once a step of immersing in the plating solution outer leads formed in the vicinity of one edge in the width direction of the film carrier tape.

5. The process according to claim 1, wherein the plating is electroplating in which a metal electrode equipped in the plating tank is used as anode and wiring patterns formed in the film carrier tape and immersed in the plating solution are used as cathodes.

6. The process according to claim 1, wherein the plating solution contained in the plating tank is a tin-bismuth alloy plating solution.

7. A plating machine for plating a film carrier tape for mounting electronic parts, comprising a plating tank containing a plating solution for plating wiring patterns on one edge of a partially immersed film carrier tape moving in a traveling direction wherein a longitudinal axis of the film carrier tape is substantially parallel to a surface of the plating solution, said plating machine having a bubble adhesion prevention means that is positioned along the traveling direction of the film carrier tape and in contact with the surface of a plating solution for collecting and breaking bubbles floating on the surface of the plating solution.

8. The plating machine according to claim 7, wherein the bubble adhesion prevention means is arranged in contact with the surface of the plating solution and in the vicinity of the film carrier tape partially immersed in the plating solution.

9. The plating machine according to claim 7, wherein the plating tank has a slit inlet opening through which the film carrier tape is continuously introduced thereinto and a slit outlet opening through which the plated film carrier tape is discharged therefrom.

10. The plating machine according to claim 7, wherein the bubble adhesion prevention means is a plastic member that is adjustably positioned so as to be partially immersed in and partially exposed from the plating solution.

11. The plating machine according to claim 7, wherein the bubble adhesion prevention means is arranged approximately parallel to the traveling direction of the film carrier tape through the plating tank.

12. The plating machine according to claim 7, which is an electroplating machine wherein a metal electrode equipped in the plating tank is used as anode and wiring patterns formed on the film carrier tape are used as cathodes.

13. The plating machine according to claim 9, wherein the slit inlet opening and the slit outlet opening are each open in a direction that enables the film carrier tape to have a substantially perpendicular relation to the surface of the plating solution contained in the plating tank.

14. The plating machine according to claim 9, which is provided with a washing nozzle in the vicinity of the slit outlet opening of the plating tank for performing the washing of the film carrier tape discharged through the slit outlet opening.

* * * * *

UNITED STATES PATENT AND TRADEMARK OFFICE
CERTIFICATE OF CORRECTION

| | | |
|---|---|---|
| PATENT NO. | : 7,160,428 B2 | Page 1 of 1 |
| APPLICATION NO. | : 10/861059 | |
| DATED | : January 9, 2007 | |
| INVENTOR(S) | : Fujimoto | |

It is certified that error appears in the above-identified patent and that said Letters Patent is hereby corrected as shown below:

Column 3, Lines 55-56, "tape 10 is constituted includes" should read -- tape 10 includes --

Signed and Sealed this

First Day of May, 2007

JON W. DUDAS
*Director of the United States Patent and Trademark Office*